United States Patent [19]

Spampinato

[11] 4,074,237
[45] Feb. 14, 1978

[54] WORD LINE CLAMPING CIRCUIT AND DECODER

[75] Inventor: Dominic Patrick Spampinato, Ozone Park, N.Y.

[73] Assignee: International Business Machines Corporation, Armonk, N.Y.

[21] Appl. No.: 665,144

[22] Filed: Mar. 8, 1976

[51] Int. Cl.² ............................................. G11C 7/00
[52] U.S. Cl. .................................... 365/230; 365/189
[58] Field of Search .................. 340/173 R, 173 DR; 307/238

[56] References Cited

U.S. PATENT DOCUMENTS

| | | | |
|---|---|---|---|
| 3,644,904 | 2/1972 | Baker | 340/173 R |
| 3,909,806 | 9/1975 | Uchida | 340/173 R |

OTHER PUBLICATIONS

Anderson et al., Decoding Scheme for MOS Random-Access Memories, IBM Technical Disclosure Bulletin, vol. 17, No. 10, 3/75, pp. 2832–2833.

*Primary Examiner*—Stuart N. Hecker
*Attorney, Agent, or Firm*—Thomas J. Kilgannon, Jr.

[57] ABSTRACT

A word line clamping circuit for use with field effect transistor memories is disclosed which permits the clamping of the word line to a reference potential using a minimum of devices and without the consumption of d.c. power so that multi-level bit line potentials may be utilized during the memory cycle. This is achieved by connecting a field effect transistor (FET) between word line and ground under control of a word line decoder so that a node associated with the last mentioned FET is held in either an uncharged or charged condition depending on whether the decoder is selecting its associated word line or not selecting it. Because the unselected word lines are held at ground during a portion of the memory cycle when reading or writing of memory cells associated with a selected word line is taking place, any capacitive coupling which might change the content of cells associated with unselected word lines is avoided and, for whatever the reason, bit line potentials may now be changed to different levels without affecting information storage during the memory cycle. Two circuits are shown which, under control of the word line decoder, permit the grounding of unselected word lines during at least a major portion of the memory cycle.

7 Claims, 4 Drawing Figures

WORD LINE CLAMPING CIRCUIT AND DECODER

BACKGROUND OF THE INVENTION

1. Field of the Invention

This invention relates to a word line clamping arrangement which either grounds or does not ground the word lines of a memory array depending on whether a word line is unselected or selected. More particularly, it relates to an FET device connected between each word line and ground under control of the decoder associated with each word line which either applies a potential to the gate of the FET to ground the word line when that word line is unselected or applies no potential to the gate of the FET when that particular word line is selected. The feature of this arrangement is that it permits a variation in bit line potential during any portion of the memory cycle because all unselected word lines are held at ground potential during at least the major part of the memory cycle. In addition, no d.c. power is consumed and at least one of the embodiments contains a minimum of devices.

2. Description of the Prior Art

In known circuit arrangements, a device which connects the word line driver to the word line is usually enabled or disabled depending upon the condition of an associated decoder circuit which permits the precharged gate of that device to remain charged or be discharged via the decoder circuit. When the word line is selected, the gate remains charged and the word line potential can be moved from a low potential to a higher potential. This variation in word line potential is connected to a cross-coupled bistable circuit which turns one of the cross-coupled devices ON providing ground potential at its associated node. This ground potential is connected to the gate of the other cross-coupled device turning that device OFF, thereby isolating the word line from ground during the period when the word line driver is ON. When the gate of the device which couples the word line driver to the word line is discharged (in the unselected word line mode) by providing a ground through the associated decoder circuit, no variation in word line potential can be applied to the word line and, as a consequence, the same device of the bistable circuit which was turned ON when the word line potential was varied is now turned OFF providing a high potential at its associated node. This high potential is connected to the gate of the other of the cross-coupled devices turning it ON. The latter device which is now conducting couples ground to the word line and maintains it in this state as long as it remains unselected. This arrangement for controlling the condition of the word line requires at least three FET devices and, while variation in the bit line potential is permitted during portions of the memory cell cycle, d.c. power is consumed and array density is affected because word line pitch cannot be held to a minimum. In another prior art arrangement which reduces the number of devices required for grounding the word lines to one FET per word line, and which consumes no d.c. power, all the word lines are grounded during a bit line pre-charge interval so that the potential on the bit line can be changed without adversely affecting the contents of the memory. However, once this has been done and the selected word line has been chosen via the usual decoder arrangements, all the FETs which ground the word lines are turned off and the selected word line is driven via the word line driver. Since none of the word lines are grounded at this point, it should be clear that it is not possible to change the potential (either more positively or more negatively) on the bit lines without capacitively coupling a signal to associated word lines which, in turn, can provide what would appear to be a readout of memory cells associated with those word lines. Since such readouts are usually spurious and destructive, information would assuredly be lost.

Thus, the known arrangements for grounding the word lines either do not provide for grounding during desired portions of the memory cycle or, if they do, cumbersome arrangements are utilized which take up large amounts of chip area and which consume considerable amounts of d.c. power. As higher and higher density arrangements are being reached, availability of chip area becomes a real consideration and circuits which take up a large amount of area become candidates for revision or elimination. The circuits being utilized usually represent a compromise in either versatility, chip surface area or power consumption. Since these compromises were just that, some aspect of memory operation had to suffer and no way in which versatility, power consumption and chip surface area could be melded in a cooperative way to provide the best possible compromise has been provided by the prior art. The present circuits while still a compromise, appear to represent the best possible compromise in that versatility in bit line variation is preserved while consuming no d.c. power for a minimum sacrifice in chip surface area.

SUMMARY OF THE INVENTION

In accordance with the broadest aspects of the present invention, a word line clamping circuit is provided which utilizes a memory array word line and a decoder circuit which includes a plurality of actuable gates adapted for either selecting or non-selecting the word line. In addition, means connected to the word line are provided for applying a word line potential to the word line when the word line is selected which include a first actuable gate and still further includes clamping means connected between the decoder and the word line for clamping the word line to a reference potential when the word line is unselected.

In accordance with the broader aspects of the present invention, a word line clamping circuit is provided wherein the means for selectively connecting the word line includes a reference potential and a first actuable gate having a control electrode, connected between the word line and the reference potential. In addition, means connected to the first actuable gate for applying a reference potential to the word line during a first and another interval are provided. Also, means connected to the first actuable gate for removing the reference potential from said word line during an interval intermediate the first and another intervals are provided.

In accordance with the broader aspects of the present invention, a word line clamping circuit is utilized wherein the means for clamping includes a second actuable gate connected between the word line and the reference potential and third, fourth and fifth actuable gates and at least one of the plurality of actuable gates operable during a first interval for placing the first and second actuable gates in an actuated state; one electrode of the fourth device being connected to an electrode of the fifth device. In addition, a sixth actuable gate, a fourth actuable gate and at least one of the plurality of actuable gates are operable during a second interval for maintaining the second device in an actuated state.

In accordance with the broader aspects of the present invention, a word line clamping circuit is utilized wherein the means for applying a reference potential during a first and another interval includes a voltage source, a second actuable gate having a control electrode which is actuable during the first and another intervals is connected to the control electrode of the first actuable gate via at least one of the plurality of actuable gates in an actuated state and to the voltage source. Also, a pulsed source operable during the first and another interval is connected to the control electrode of the second actuable gate.

In accordance with more specific aspects of the present invention, a word line clamping circuit is utilized wherein the means for removing reference potential during an intermediate interval includes a third actuable gate connected between the control electrode of the first actuable gate and reference potential. The third actuable gate has a control electrode and a pulsed source actuable during the intermediate interval connected to its control electrode.

In accordance with still more specific aspects of the present invention, a circuit is utilized which includes means connected to the word line for inhibiting the application of word line potential to the word line in an interval after said another interval.

In accordance with still more specific aspects of the present invention, a clamping circuit is provided wherein the actuable gates are field effect transistors and the reference potential is ground.

It is, therefore, an object of this invention to provide a word line clamping circuit which utilizes no d.c. power.

Another object is to provide a word line clamping circuit which permits the application of multi-level bit line potentials during the memory cycle.

Still another object is to provide a word line clamping circuit which utilizes a minimum of additional devices and therefore improved density in situations where multi-level bit line potentials are required during memory operation.

Still another object is to provide a word line clamping circuit which maintains unselected word lines at ground potential during the whole of a memory cycle.

Still another object is to provide a word line clamping circuit which eliminates the possibility for destructive readout of memory cells associated with unselected word lines during the whole of the memory cycle.

The foregoing and other objects, features and advantages of the invention will become apparent from the following more particular description of the preferred embodiments of the invention as illustrated in the accompanying drawings.

DESCRIPTION OF THE PREFERRED EMBODIMENTS

Figure 1:
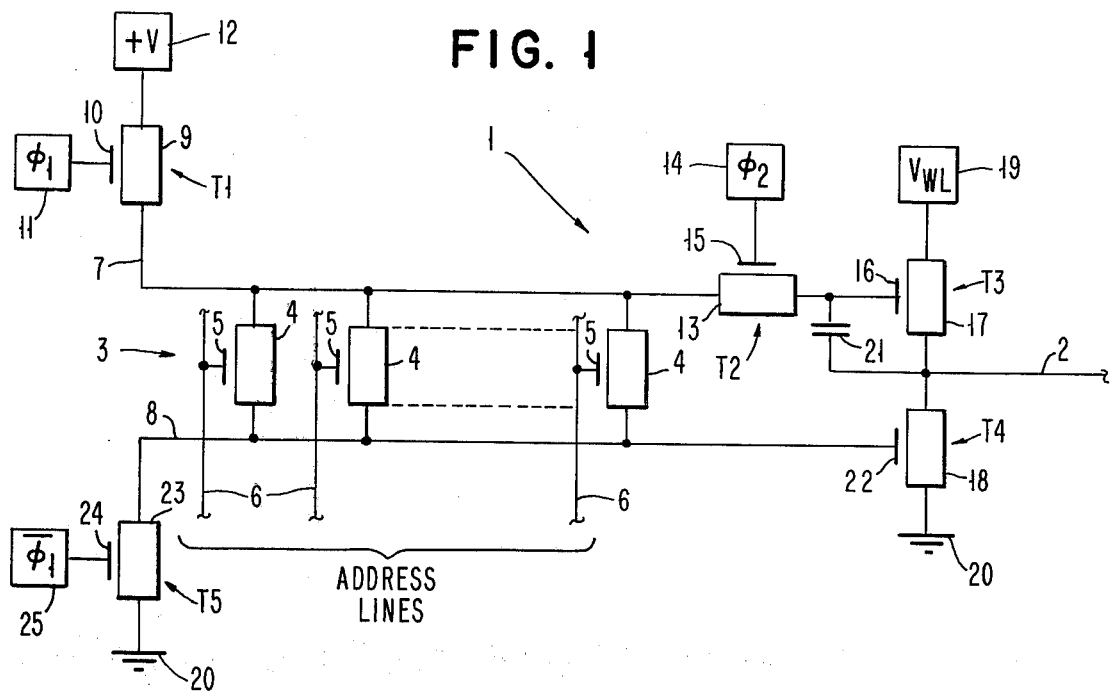
FIG. 1 shows a schematic drawing of a word line clamping circuit in accordance with the teaching of the present invention, which includes a standard word line decoder and an actuable gate connected between the word line and ground which is actuated or maintained in an actuated state as a function of the selected or unselected condition of the word line decoder circuit.

Referring now to FIG. 1, there is shown therein a word line clamping circuit arrangement 1. Circuit arrangement 1 is shown connected to a memory array word line 2 and includes a decoder circuit 3 which further includes a plurality of actuable gates 4, each of which has a gate electrode 5. Each gate electrode 5 is connected to an address line 6 and the sources and drains of actuable gates 4 are connected together by interconnecting lines 7,8, respectively. One end of interconnection line 7 is connected to an actuable gate 9 otherwise identified in FIG. 1 as field effect transistor, T1. Transistor T1 and all the other FETs mentioned in what follows may be, for example, enhancement mode N-P-N field effect transistors. Actuable gate T1 has a gate electrode 10 to which a pulsed source of voltage 11, otherwise identified in FIG. 1 as $\phi 1$, is connected. A voltage source 12, otherwise identified as +V in FIG. 1, is shown connected to the drain of actuable gate T1.

The other end of interconnecting line 7 is shown connected to an actuable gate 13, otherwise identified in FIG. 1 as FET device T2, which is itself actuated by the application of a pulsed voltage from a pulsed source 14, otherwise identified in FIG. 1 as $\phi 2$, connected to its gate electrode 15. The drain electrode of FET device T2 is connected to the gate electrode 16 of actuable gate 17, otherwise shown in FIG. 1 as FET device T3; the source of which is connected to word line 2 and an actuable gate 18, otherwise shown in FIG. 1 as FET device T4. The drain of FET device T3 is shown connected to a pulsed source 19 of word line potential otherwise identified in FIG. 1 as $V_{WL}$. The source of FET device T4 is shown connected to reference potential 20, otherwise shown in FIG. 1 as the symbol for ground. A bootstrap capacitor 21 is shown in FIG. 1 connected between gate electrode 16 and word line 2. FET device T4 has a gate electrode 22 which is connected to one end of interconnecting line 8 which, as has been previously indicated, connects the sources of actuable gates 4 together. The other end of interconnecting line 8 is connected to actuable gate 23, otherwise identified in FIG. 1 as FET device T5. The source of FET T5 is connected to reference potential 20, otherwise identified by the ground symbol in FIG. 1, while its gate electrode 24 is shown connected to a pulsed source of voltage 25, otherwise identified in FIG. 1 as $\phi 1$.

While not specifically shown in FIG. 1, it will be appreciated by one skilled in the art that a plurality of word lines 2 are present in memory arrays and that a word line circuit arrangement 1 is connected to each of them including its associated decoder circuit 3.

Figure 2:
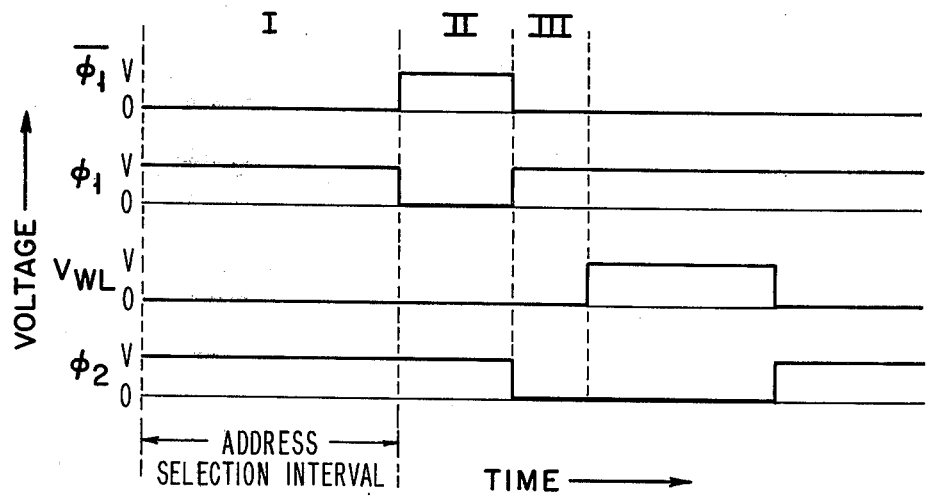
FIG. 2 is a representation of the voltage pulse pattern supplied to the clamping circuit during first, second and third time intervals. During these intervals, if the word line in question is unselected, an actuable gate connecting the word line to reference potential has its gate capacitance charged, discharged and charged, respectively.

Referring now to FIGS. 1 and 2, the pulse pattern of the latter will be considered with the former to describe the operation of the clamping circuit of FIG. 1. During an address selection interval, otherwise identified in FIG. 2 by I, pulsed sources $\phi1,\phi2$ are turned ON while pulsed source $\overline{\phi1}$ and word line voltage source 19 are turned OFF. With a positive potential applied to gate electrode 10 from pulsed source $\phi1$ and a positive voltage applied to the drain of FET T1 from voltage source 12, FET T1 is actuated and because FET T2 is simultaneously actuated from pulsed source $\phi2$, the gate capacitance of gate electrode 16 of FET T3 is charged up to approximately the potential +V via actuated FET T2. FET T3 is enabled and, because pulsed voltage source 19 is at ground during this time, ground is applied to word line 2. As is well known, if the word line 2 in question is selected, none of address lines 6 will have a signal thereon and, as a result, none of the plurality of actuable gates 4 will be enabled. Thus, only FET 3 is enabled via FETs T1, T2 and transmission line 7. If, however, the particular word line 2 is not one which has been selected, i.e., it is unselected, one or more of the plurality of actuable gates 4 will be actuated by signals on one or more of address lines 6. As a result, during interval I, in addition to FET T3 being enabled, FET T4 is actuated and reference potential 20 is applied via T4 to word line 2. Thus, T4 is actuated by the gate capacitance of gate electrode 22 being charged from voltage source +V via FET T1, one of the plurality of actuable gates 4 and interconnection line 8, which is coupled to gate electrode 22 of FET T4.

During interval II, pulsed source $\phi1$ turns OFF while pulsed source $\overline{\phi1}$ turns ON. The address selection interval shown in FIG. 2 terminates at the beginning of interval II. Also, during interval II, pulsed source $\phi2$ remains in the ON condition. As a consequence, charge stored on the gate capacitances of gate electrodes 16,22 of FETs T3,T4, respectively, is conducted to ground via transistor T5 which is now in the ON condition as a result of pulsed source $\phi1$ being pulsed OFF. Charge from gate electrode 16 is discharged to reference potential 20 via conducting transistor T2, one of the plurality of actuable gates 4 being in the ON condition if the word line is unselected, and actuated FET T5. If the word line is a selected word line, none of the plurality of actuable gates 4 is actuated and no path for charge stored on the gate capacitance of gate electrode 16 is available, even though both FET T2 and T5 are in the conducting condition. Thus, at the end of interval II, the gate capacitance of gate electrode 22 has been discharged to ground and the gate capacitance of gate electrode 16 has either been discharged or remains charged, depending on whether or not the word line 2 in question is unselected or selected, respectively.

At the beginning of interval III, pulsed sources $\overline{\phi1}$ and $\phi2$ are turned OFF and pulsed source $\phi1$ is turned ON. Where the word line 2 in question is selected, FET T3 is in the actuated state and the actuation of pulsed source $\phi1$ has no effect since the charge on the gate capacitance of gate electrode 16 is trapped therein because FET T2 is now non-conductive as a result of the turning OFF of pulsed source $\phi2$. Thus, device T3 remains actuated and, in an interval after interval III, when pulsed source 19 which provides a voltage $V_{WL}$ is actuated, word line drive is applied via T3 to word line 2.

If the word line in question were unselected, at the beginning of interval III, the gate capacitance of FET device T3 has been discharged along with the gate capacitance of device T4 and, when pulsed source $\phi1$ goes ON and pulsed source $\phi2$ goes OFF, the gate capacitance of FET T3 cannot be charged up because FET device T2 is now in an unactuated state. However, because at least one of the plurality of actuable gates 4 is ON, the gate capacitance of FET device T4 can be charged up via actuated gate T1 and one of the actuable gates 4. Under such circumstances, actuated gate T4 connects reference potential 20 or ground to word line 2. Thus, it is seen that selected word lines are connected to their word driver source via an actuated FET T3 and an unselected word line 2 is connected to ground via FET device T4, depending on whether the decoder is operable in a selected or non-selected mode. From the foregoing, it should be clear that after word line 2 is grounded via the actuation of FET device T4, it remains in that condition until a new address is selected, permitting multi-level potentials to be placed on memory cell word lines without fear of coupling to other unselected word lines which, as a result of the present invention, are all in the grounded condition. To the extent that transistor T5 may not normally be present in decoder 3, the arrangement of FIG. 1 requires the addition of two devices, T4,T5, over those normally utilized in known circuits. Where FET device T5 is normally present, of course, the circuit arrangement 1 can be implemented by the addition of a single FET device T4.

Figure 3:
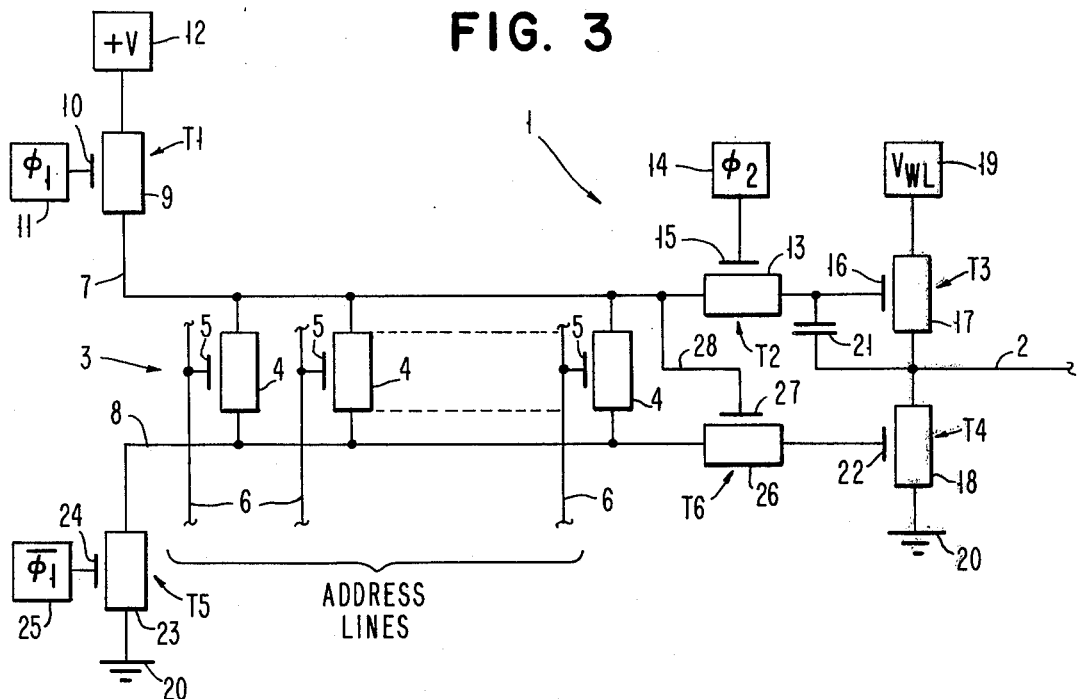
FIG. 3 shows a word line clamping circuit in accordance with the teaching of the present invention which, by the addition of another field effect transistor the gate of which is connected to an electrode of another field effect transistor, eliminates the need for a second charging.
Figure 4:
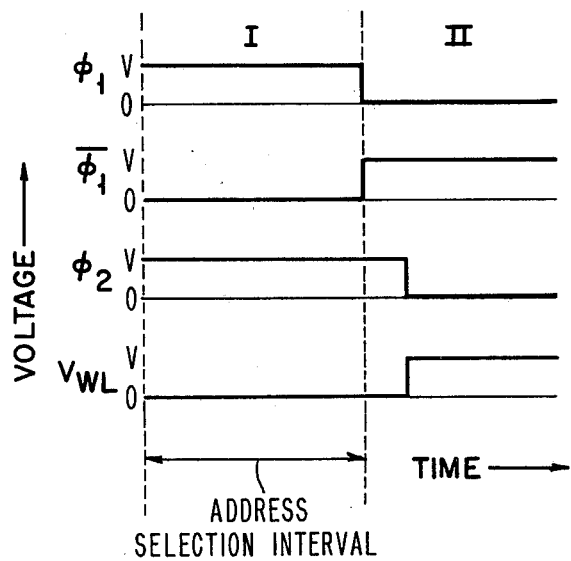
FIG. 4 is a representation of the voltages applied to the circuit of FIG. 3 during first and second time intervals.

Referring now to FIG. 3, there is shown therein a schematic diagram of a word line clamping circuit which utilizes an additional FET device but advantageously requires only one charge and one discharge cycle. Elements which are the same in FIGS. 1 and 3 have been designated by the same reference numbers. The only addition to FIG. 3 is actuable gate 26, otherwise shown as FET device T6 in FIG. 3. Gate electrode 27 of FET device T6 is shown connected to interconnection line 7 which in turn is connected to the source of FET device T2. The addition of FET device T6 permits the application or non-application of ground to word line 2 in two intervals as opposed to the three intervals described in connection with FIGS. 1 and 2. Considering now FIG. 3 in combination with the pulse pattern shown in FIG. 4, it should be clear that, when word line 2 is selected, the gate capacitance of FET device T3 is charged up via actuated FET devices T1,T2 and interconnection line 7. Because none of the plurality of FET devices 4 have been actuated where the word line is selected, no charge is coupled via ON FET device T6 to gate 22 of FET device T4, where none was previously present. At the end of interval I, pulsed source $\phi1$ goes OFF while pulsed source $\phi2$ remains ON. When pulsed source $\phi1$ goes OFF, pulsed source $\overline{\phi1}$ goes ON simultaneously, actuating FET device T5 and applying ground potential to interconnection line 8. During this time, FET device T6 is held ON because the potential on the gate capacitance of FET device T3 is connected via actuated device T2 to gate 27 of FET T6 via interconnection 28. Ground potential now appears on gate electrode of FET device T4, holding the latter in an unactuated condition.

When the word line 2 in question is unselected, since one of the plurality of actuable devices 4 is conducting, the gate capacitances of both FET devices T3,T4 are charged, actuating these devices. It should be noted that FET device T6 is actuated because the potential +V appears on its gate 27 via interconnection line 7 and interconnection 28. Thus, both devices T3 and T4 apply ground to word line 2 during interval I. At the beginning of interval II, pulsed source $\phi1$ goes OFF, pulsed source $\overline{\phi 1}$ goes ON and pulsed source $\phi 2$ remains ON. With pulsed source $\phi 2$ ON, FET device T2 is in the conducting state and, because pulsed source $\overline{\phi 1}$ is ON, FET device T5 is actuated and charge on the gate capacitance of device T3 is conducted to ground via actuated devices T2,T5 and at least one of actuable gates 4. At this point, it should be appreciated that the potential on gate 27 is dropping at a given rate as a result of the discharge of the gate capacitance of FET device T3 to ground 20 via actuated device T5. Because the source of transistor T6 is connected to the source of FET device T2 via one of the ON devices 4 of decoder 3, both the gate and source of FET device T6 have a potential applied thereto which is decaying at the same rate. As a result, FET device T6 does not turn ON and charge which was applied to the gate capacitance of device T4 during interval I remains trapped, maintaining device T4 in the actuated state and applying ground 20 to word line 2.

Because the processing and fabrication of an integrated circuit incorporating the teachings of the present invention form no part of the novelty of the present application, let it suffice to say that techniques well known to those skilled in the semiconductor fabrication art, including photolithographic, etching, masking, diffusion and metallizing techniques, may be utilized. Also, while a specific type of device has been mentioned for use in the circuits of FIGS. 1,3, it should be clear to one skilled in the art that both N-P-N and P-N-P enhancement mode field effect transistors can be utilized. It should also be clear that P-N-P field effect transistors can be utilized by simply reversing the positive polarity of the signals shown in FIGS. 2,4. Also, it should be appreciated that the devices utilized are typical of those employed in known decoder, word driver and gating circuits. FET devices T1–T6 have no special criticality and can be designed using requirements well known to those skilled in the semiconductor arts. Typical gate voltages would be 15 volts; typical substrate voltage is −2; and typical threshold potentials are 1.5 volts.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A word line clamping circuit comprising
a memory array word line,
a decoder circuit adapted for operating in a selected and nonselected mode including a plurality of actuable field effect transistors,
means connected to said word line for applying word line potential to said word line when said word line is selected including a first field effect transistor having source, drain and gate electrodes and a bootstrap capacitor connected across the drain and gate electrodes thereof,
means connected to said decoder and said word line for clamping said word line to a reference potential when said word line is unselected including a second field effect transistor having source, drain and gate electrodes connected between said word line and said reference potential, third, fourth and fifth field effect transistors each having source, drain and gate electrodes and at least one of said plurality of actuable field effect transistors operable during a first interval for applying charge to said first and second field effect transistors rendering them operable, the source electrode of said fourth field effect transistor being connected to the gate electrode of said fifth field effect transistor,
means connected to said fourth field effect transistor and at least one of said plurality of field effect transistors for maintaining them operable during at least a portion of a second interval, and,
means connected to said fifth field effect transistor for rendering it inoperable during said second interval to trap charge on said gate of said second field effect transistor holding said last-mentioned transistor operable and maintaining reference potential on said word line.

2. A word line clamping circuit according to claim 1 wherein said means for applying a word line potential further includes a pulsed source operable during a portion of said second interval connected to said first field effect transistor.

3. A word line clamping circuit according to claim 1 further including means connected to at least one of said plurality of actuable field effect transistors for actuating said at least one of said plurality of actuable field effect transistors.

4. A word line clamping circuit according to claim 1 further including a voltage source, and first and second pulsed sources connected to said third and fourth actuable field effect transistors operable during said first interval for connecting said voltage source to said first and second field effect transistors when said word line is unselected.

5. A word line clamping circuit according to claim 1 wherein in said means connected to said fourth field effect transistor and at least one of said plurality of field effect transistors includes a second pulsed source connected to said gate of said fourth field effect transistor operable during a portion of said second interval and an address line connected to said gate of said at least one of said plurality of field effect transistors operable during said second interval.

6. A word line clamping circuit according to claim 1 wherein said means connected to said fifth field effect transistor for rendering it inoperable includes a sixth field effect transistor operable during said second interval connected to said source of said fifth field effect transistor and to said plurality of field effect transistors to provide a discharge path for said boot strap capacitor, the decaying potential thereof appearing simultaneously on said source and said gate of said fifth field effect transistor rendering it inoperable.

7. A word line clamping circuit according to claim 6 further including a third pulsed source operable during said second interval for placing said sixth field effect transistor in an actuated state applying reference potential to said fifth field effect transistor and to said plurality of field effect transistors.

* * * * *